United States Patent
Ishikawa et al.

(10) Patent No.: US 9,478,791 B2
(45) Date of Patent: Oct. 25, 2016

(54) METHOD FOR FORMING PATTERN, STRUCTURAL BODY, METHOD FOR PRODUCING COMB-SHAPED ELECTRODE, AND SECONDARY CELL

(71) Applicant: Tokyo Ohka Kogyo Co., Ltd., Kawasaki-shi (JP)

(72) Inventors: Kaoru Ishikawa, Kawasaki (JP); Takahiro Asai, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 65 days.

(21) Appl. No.: 14/426,300

(22) PCT Filed: Aug. 28, 2013

(86) PCT No.: PCT/JP2013/073058
§ 371 (c)(1),
(2) Date: Mar. 5, 2015

(87) PCT Pub. No.: WO2014/038454
PCT Pub. Date: Mar. 13, 2014

(65) Prior Publication Data
US 2015/0243965 A1    Aug. 27, 2015

(30) Foreign Application Priority Data

Sep. 7, 2012   (JP) .................................. 2012-197802
Feb. 14, 2013  (JP) .................................. 2013-026856

(51) Int. Cl.
*G03F 7/00* (2006.01)
*H01M 6/40* (2006.01)
(Continued)

(52) U.S. Cl.
CPC .......... *H01M 4/0414* (2013.01); *G03F 7/0035* (2013.01); *H01M 4/0404* (2013.01);
(Continued)

(58) Field of Classification Search
CPC ..... G03F 7/0035; G03F 7/0037; H01M 6/40
See application file for complete search history.

(56) References Cited

U.S. PATENT DOCUMENTS 5,388,328 A    2/1995  Yokono et al.
5,663,019 A *  9/1997  Matsumura ........... G03F 7/0035
                                           205/121

(Continued)

FOREIGN PATENT DOCUMENTS

JP    H 10-228864    8/1998
JP    2000-113814    4/2000

(Continued)

OTHER PUBLICATIONS

Extended European Search Report in European Patent Application No. 13835967.4, dated Jul. 16, 2015.

(Continued)

*Primary Examiner* — James M Mellott
(74) *Attorney, Agent, or Firm* — Knobbe Martens Olson & Bear LLP

(57) ABSTRACT

A method for forming a pattern multiple patterns of identical or different pattern materials can be formed on a support in a short time, a structural body, a method for producing a comb-shaped electrode, and a secondary cell. The pattern forming method, in which n patterns (n≥2) are formed on a support, includes forming a first resist layer on the support surface; repeating: forming a guide hole through all resist layers by exposure and development, filling a kth pattern material into the guide hole by a screen printing process, and forming a (k+1)th resist layer on the kth resist layer and the pattern materials, regarding kth (k=1 to n−1) pattern material and resist layer in order of k=1 to n−1; performing guide hole formation and nth pattern material filling similarly, and removing all of the resist layers.

2 Claims, 7 Drawing Sheets

(51) Int. Cl.
*H01M 4/04* (2006.01)
*H01M 4/13* (2010.01)
*H01M 4/70* (2006.01)
*H01M 4/139* (2010.01)
*H01M 10/058* (2010.01)
*G03F 7/40* (2006.01)
*H01L 21/288* (2006.01)
*H01M 10/052* (2010.01)
*H01M 10/0565* (2010.01)
*H01M 4/02* (2006.01)
*H01L 21/768* (2006.01)
*G03F 7/12* (2006.01)

(52) U.S. Cl.
CPC ............ *H01M 4/13* (2013.01); *H01M 4/139* (2013.01); *H01M 4/70* (2013.01); *H01M 6/40* (2013.01); *H01M 10/058* (2013.01); *G03F 7/0037* (2013.01); *G03F 7/12* (2013.01); *G03F 7/40* (2013.01); *H01L 21/288* (2013.01); *H01L 21/76885* (2013.01); *H01M 10/052* (2013.01); *H01M 10/0565* (2013.01); *H01M 2004/025* (2013.01); *Y02E 60/122* (2013.01); *Y02P 70/54* (2015.11)

(56) References Cited

U.S. PATENT DOCUMENTS

| | | | |
|---|---|---|---|
| 6,106,992 | A | 8/2000 | Asano et al. |
| 6,350,674 | B1 | 2/2002 | Okamura |
| 2003/0045076 | A1* | 3/2003 | Hayashida ............ G03F 7/0035 438/527 |
| 2003/0180633 | A1 | 9/2003 | Sato et al. |
| 2006/0154141 | A1 | 7/2006 | Salot et al. |
| 2009/0208886 | A1 | 8/2009 | Takemura et al. |
| 2011/0256484 | A1* | 10/2011 | Asai .................... H01M 4/0452 430/319 |

FOREIGN PATENT DOCUMENTS

| | | |
|---|---|---|
| JP | 2000-123729 | 4/2000 |
| JP | 2001-144128 | 5/2001 |
| JP | 2003-68667 | 3/2003 |
| JP | 2011-238589 | 11/2011 |

OTHER PUBLICATIONS

Office Action in European Patent Application No. EP13835967.4 dated May 17, 2016.

* cited by examiner

METHOD FOR FORMING PATTERN, STRUCTURAL BODY, METHOD FOR PRODUCING COMB-SHAPED ELECTRODE, AND SECONDARY CELL This application is the U.S. National Phase under 35 U.S.C. §371 of International Application No. PCT/JP2013/073058, filed Aug. 28, 2013, designating the U.S., and published in Japanese as WO 2014/038454 on Mar. 13, 2014, which claims priority to Japanese Patent Application No. 2012-197802, filed Sep. 7, 2012; and Japanese Patent Application No. 2013-026856, filed Feb. 14, 2013, the entire contents of which are incorporated herein by reference.

TECHNICAL FIELD

The present invention relates to a method for forming a pattern in which a plurality of patterns of identical or different pattern materials are formed on a support, a structural body comprising the pattern formed by the method for forming a pattern, a method for producing a comb-shaped electrode using the method for forming a pattern, and a secondary cell comprising the comb-shaped electrode produced by the production method.

BACKGROUND ART

Conventionally, when patterning an electrode or fluorescence substance on a support, a method has been employed in which a resist layer is formed on the support in advance, a guide hole acting as a casting mold during forming a pattern is formed, then a pattern material for the electrode or fluorescence substance is filled into the guide hole by a process such as injection and electrophoresis. For example, Patent Document 1 discloses in Examples that a comb-shaped electrode is prepared by forming a guide hole using a resist composition and depositing a positive-electrode active material into the guide hole by an electrophoresis process.

Patent Document 1 Japanese Unexamined Patent Application, Publication No. 2011-238589

DISCLOSURE OF THE INVENTION

Problems to be Solved by the Invention

However, it takes considerable time to fill the guide hole when using the process such as injection and electrophoresis, which makes it difficult to mass-produce patterns by the pattern forming method using these processes.

The present invention has been made in view of the problems described above; and it is an object of the present invention to provide a method for forming a pattern in which a plurality of patterns of identical or different pattern materials can be formed on a support in a short time, a structural body comprising the pattern formed by the method for forming a pattern, a method for forming a comb-shaped electrode using the method for forming a pattern, and a secondary cell comprising the comb-shaped electrode produced by the production method.

Means for Solving the Problems

The present inventors have thoroughly investigated to solve the problems described above. As a result, it has been found that the above-mentioned problems can be solved by way of filling a pattern material into a guide hole by a screen printing process when forming a pattern, thereby completing the present invention. Specifically, the present invention provides the following.

A first aspect of the present invention relates to a method for forming a pattern, in which n patterns (n: an integer of at least 2) of identical or different pattern materials are formed on a support; and the method includes forming a first resist layer by coating a positive-type resist composition on a surface of the support, with respect to a kth pattern material and a kth resist layer in order of from k=1 to k=n−1 (k: an integer of 1 to n−1), repeating the steps of (i) to (iii): (i) forming a guide hole through 1st to kth resist layers by exposure and development, (ii) filling a kth pattern material into the guide hole by a screen printing process, and (iii) forming a (k+1)th resist layer by coating a positive-type resist composition on the kth resist layer and the kth pattern material that has been filled into the guide hole, forming a guide hole through 1st to nth resist layers by exposure and development, filling a nth pattern material into the guide hole by a screen printing process, and removing the 1st to nth resist layers.

A second aspect of the present invention relates to a structural body comprising the pattern formed by the method for forming a pattern.

A third aspect of the present invention relates to a method for producing a comb-shaped electrode, in which a positive electrode and a negative electrode are each formed into a comb shape and oppositely disposed so that parts of teeth of the comb shapes are alternately arranged; and the method includes forming a conductive layer on a surface of a substrate, forming a current collector by patterning the conductive layer, and forming the positive electrode and the negative electrode on the current collector using the method for forming a pattern.

A fourth aspect of the present invention relates to a secondary cell comprising the comb-shaped electrode produced by the above-mentioned production method.

Effects of the Invention

In accordance with the present invention, there can be provided a method for forming a pattern in which a plurality of patterns of identical or different pattern materials can be formed on a support in a short time, a structural body comprising the pattern formed by the method for forming a pattern, a method for producing a comb-shaped electrode using the method for forming a pattern, and a secondary cell comprising the comb-shaped electrode produced by the production method.

BRIEF DESCRIPTION OF THE DRAWINGS

FIG. 9A is a graph that shows the relationship between the cycle number and the capacity retention rate, and FIG. 9B is a graph that shows the relationship between the cycle number and the coulomb efficiency.

EXPLANATION OF REFERENCE NUMERALS

Figure 1A:
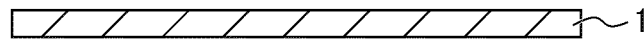
FIGS. 1A to 1H are transverse sectional views showing the method for forming a pattern in accordance with an embodiment of the present invention.

1: support
2: first resist layer
3a, 3b: guide hole
4a, 4b: pattern material layer
5: second resist layer
11a, 11b: comb-shaped electrode
12a, 12b: current collector
13a, 13b: active material layer
14: substrate

PREFERRED MODE FOR CARRYING OUT THE INVENTION

Hereinafter, embodiments of the present invention are explained in detail with reference to figures.

FIGS. 1A to 1H are transverse sectional views showing the method for forming a pattern in accordance with an embodiment of the present invention. The pattern forming method in accordance with the embodiment of the present invention is explained with reference to FIGS. 1A to 1H.

Here, the case of n=2 is explained in FIGS. 1A to 1H.

Figure 1B:
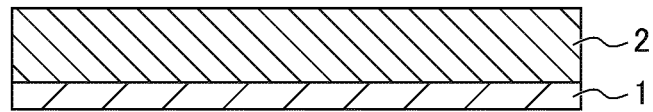

Initially, in the step shown in FIG. 1B, the first resist layer 2 is formed by coating a positive-type resist composition on the surface of the support 1 shown in FIG. 1A.

Conventional processes may be used for the process to form the first resist layer 2 by coating the positive-type resist composition on the surface of the support 1, without particular limitation thereto. In the first resist layer 2, the guide holes 3a and 3b are formed in order to form the pattern material layers 4a and 4b, as described later. The guide holes 3a and 3b become a casting mold when forming the pattern material layers 4a and 4b and thus are required to have sufficient depth for forming the pattern material layers 4a and 4b. The thickness of the first resist layer 2 becomes the future depth of the guide holes 3a and 3b and thus is appropriately set considering the necessary depth of the guide holes 3a and 3b. The thickness of the first resist layer 2 may be exemplified by 10 to 100 µm, without particular limitation thereto.

The positive-type resist composition used for forming the first resist layer 2 may be conventional ones without particular limitation thereto and may be non-chemical amplification type or chemical amplification type. The non-chemical amplification-type positive-type resist composition may be exemplified by those containing at least a quinonediazide group-containing compound and an alkali-soluble resin. On the other hand, the chemical amplification-type positive-type resist composition may be exemplified by those containing at least a photoacid generator and a resin which has an acid-dissociating elimination group and increases alkali solubility when the elimination group is eliminated by action of an acid generated from the photoacid generator through exposure.

Figure 1C:
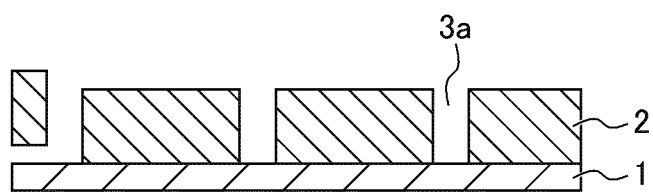

Next, the step shown in FIG. 1C is explained.

In this step, initially, the first resist layer 2 is selectively exposed through a desired mask. Consequently, the part to be the future guide hole 3a becomes soluble to a developer and the part not to be the future guide hole 3a retains its insolubility to the developer.

The selectively exposed first resist layer 2 is developed. The development can be carried out by conventional processes using conventional developers. The developer may be exemplified by alkaline aqueous solutions. Additionally, the developing process may be exemplified by immersion processes, spray processes, etc.

The guide hole 3a penetrating up to the surface of the support 1 is formed in the developed first resist layer 2. The guide hole 3a is used as a casting mold in order to deposit a pattern material in the step shown in FIG. 1D (explained below). As necessary, after-curing by irradiation with an active energy beam such as UV rays or post-baking as additional heat treatment is applied to the first resist layer 2 where the guide hole 3a has been formed. Solvent resistance and plating solution resistance of the first resist layer 2 necessary at the step of filling a pattern material, as described later, are further improved by applying the after-curing or post-baking.

Figure 1D:
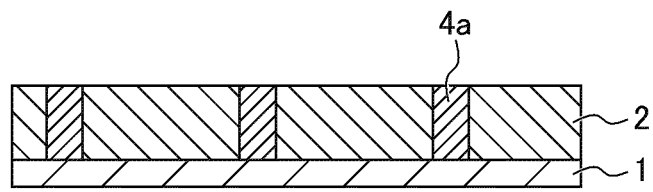

Next, the step shown in FIG. 1D is explained.

In this step, a first pattern material is filled into the guide hole 3a formed in the step shown in FIG. 1C by a screen printing process. That is, the first pattern material layer 4a is formed on the surface of the support 1 using the guide hole 3a as a casting mold.

The screen printing process may be carried out using a commercially available screen printer while appropriately adjusting squeegee pressure; squeegee speed; material, hardness, grinding angle, etc. of the squeegee used, for example.

Figure 1E:
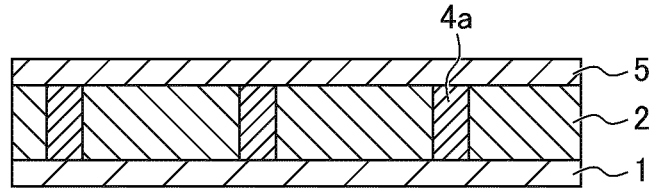

Next, the step shown in FIG. 1E is explained.

In this step, the positive-type resist composition is coated on the first resist layer 2 and the first pattern material that has been filled into the guide hole 3a (namely, the first pattern material layer 4a) to thereby form the second resist layer 5. The second resist layer 5 functions as the protective layer of the first pattern material layer 4a. That is, if the guide hole 3b is formed without forming the second resist layer 5, as described later, the first pattern material layer 4a contacts the developer and flows out in the process. As described above, the contact to the developer and flow out of the first pattern material layer 4a can be prevented by forming the second resist layer 5.

The type and coating process of the positive-type resist composition are similar to those described above as to the step shown in FIG. 1B. The positive-type resist composition used in the step shown in FIG. 1E may be the same as the positive-type resist composition used in the step shown in FIG. 1B, but is preferably different therefrom in terms of compositional component or type.

The thickness of the second resist layer 5 is not particularly limited as long as its function as the protective layer for the first pattern material layer 4a is assured; and the thickness thereof is appropriately set considering the depth required for the guide hole 3b formed in the step shown in FIG. 1F explained below and may be exemplified by 1 to 20 μm.

Figure 1F:
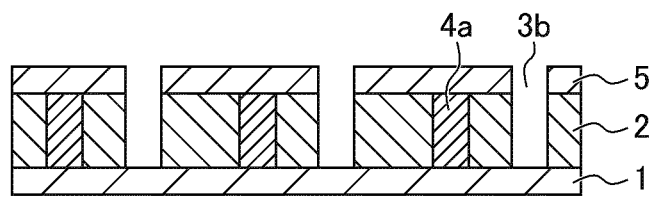

Next, the step shown in FIG. 1F is explained.

In this step, initially, the first resist layer 2 and the second resist layer 5 are selectively exposed through a desired mask. Consequently, the part to be the future guide hole 3b becomes soluble to a developer and the part not to be the future guide hole 3b retains its insolubility to the developer.

The selectively exposed first resist layer 2 and second resist layer 5 are developed. The developer and the developing process are similar to those explained in terms of the step shown in FIG. 1C.

The guide hole 3b penetrating up to the surface of the support 1 is formed in the developed first resist layer 2 and second resist layer 5. The guide hole 3b is used as a casting mold in order to deposit a pattern material in the step shown in FIG. 1G (explained below). As necessary, after-curing by irradiation with an active energy beam such as UV rays or post-baking as additional heat treatment is applied to the first resist layer 2 and second resist layer 5 where the guide hole 3b has been formed. Solvent resistance and plating solution resistance of the first resist layer 2 and second resist layer 5 necessary at the step of filling a pattern material, as described later, are further improved by applying the after-curing or post-baking.

Figure 1G:
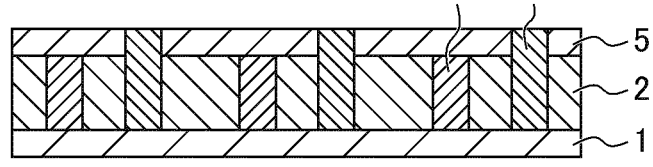

Next, the step shown in FIG. 1G is explained.

In this step, a second pattern material is filled into the guide hole 3b formed in the step shown in FIG. 1F by a screen printing process. That is, the second pattern material layer 4b is formed on the surface of the support 1 using the guide hole 3b as a casting mold.

The conditions of the screen printing process are similar to those explained in terms of the step shown in FIG. 1D.

Figure 1H:
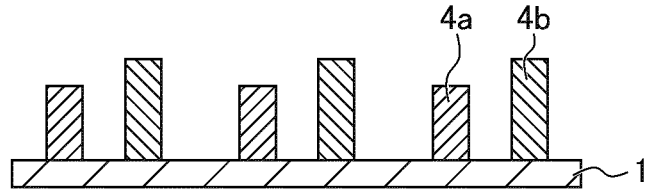

Next, the step shown in FIG. 1H is explained.

In this step, the first resist layer 2 and the second resist layer 5 are removed. Specifically, a process of peeling these resist layers using a peeling liquid may be exemplified. In this case, immersion processes, spray processes, shower processes, puddle processes, etc. may be used as the peeling process without particular limitation thereto. Additionally, the peeling liquid may be exemplified by 3 to 15 mass % aqueous solution of sodium hydroxide, aqueous solution of potassium hydroxide, organic amines, tetramethyl ammonium hydroxide, triethanolamine, N-methylpyrrolidone, dimethyl sulfoxide, and acetone. The peeling treatment time may be exemplified by about 1 to 120 minutes without particular limitation thereto. Here, the peeling liquid may be warmed to about 25 to 60° C.

By the way described above, two patterns of the first and second pattern materials can be formed on the support.

The case of n=2 is explained in FIGS. 1A to 1H; concerning the cases where n is at least 3, n patterns of identical or different pattern materials can be formed on the support by repeating necessary times of the steps shown in FIGS. 1C to 1E.

The pattern material may be appropriately selected depending on the application of the resulting pattern without particular limitation thereto and may be exemplified by positive-electrode material/negative-electrode material, fluorescent body (RGB), medical marker, article tag, etc.

The structural body according to the present invention comprises the pattern resulting from the pattern forming method described above. Such a structural body may be exemplified by cells and specifically secondary cells comprising a comb-shaped electrode.

The comb-shaped electrode may be exemplified by one in which a positive electrode and a negative electrode are each formed into a comb shape and oppositely disposed so that the parts of teeth of the comb shapes are alternately arranged. More specifically, the comb-shaped electrodes 11a and 11b shown in FIG. 2 may be exemplified.

The comb-shaped electrodes 11a and 11b are simply explained with reference to FIG. 2. The comb-shaped electrodes 11a and 11b are each formed into a comb shape and oppositely disposed so that the parts of teeth of the comb shapes are alternately arranged. Here, the comb-shaped electrode 11a is a positive electrode and the comb-shaped electrode 11b is a negative electrode. Such a configuration of the comb-shaped electrodes 11a and 11b leads to a shorter distance between the electrodes and a constant electrolyte resistance, thus exchange of lithium ion can be effectively performed, thereby electric capacitance can be increased.

Between the comb-shaped electrode 11a and the comb-shaped electrode 11b, there is provided space or a separator (not shown) for isolating the both, and the both are electrically separated. The comb-shaped electrodes 11a and 11b are formed on the surface of the substrate 14 of which the surface is a non-conductor. Such a substrate 14 may be exemplified by silicon substrates having an oxide film on their surface.

The comb-shaped electrode 11a of a positive electrode has the current collector 12a to draw a current and the positive-electrode active material layer 13a formed on the surface of the current collector 12a. The current collector 12a is formed into a comb shape in planar view. Then, the positive-electrode active material layer 13a is formed on the surface of the comb-shaped current collector 12a and formed into a comb shape in planar view similarly to the current collector 12a.

In order to impart conductivity, the current collector 12a is constructed from metal and preferably gold. Then, in order to ensure the adhesion between the current collector 12a and the substrate 14, an adhesion imparting layer (not shown) is formed between the current collector 12a and the substrate 14 as necessary. The adhesion imparting layer is appropriately set considering the material of the current collector 12a and the material of the substrate 14. As an example, when the current collector 2a is constructed from gold and the substrate 14 is constructed from silicon, a thin film of titanium is preferably used as the adhesion imparting layer.

The thickness of the current collector 12a and the thickness of the adhesion imparting layer may be optionally set without particular limitation thereto. As an example, the thickness of the current collector 12a is 100 nm and the thickness of the adhesion imparting layer is 50 nm, without particular limitation thereto.

The comb-shaped electrode 11b of a negative electrode has the current collector 12b to draw a current and the negative-electrode active material layer 13b formed on the surface of the current collector 12b. The other items of the comb-shaped electrode 11b are similar to those of the comb-shaped electrode 11a of a positive electrode; therefore, explanations thereof are omitted.

An electrolyte (not shown) is provided between the comb-shaped electrode 11a of a positive electrode and the comb-shaped electrode 11b of a negative electrode. Consequently, the comb-shaped electrode 11a and the comb-shaped electrode 11b each cause an electrode reaction, and the current can be drawn from the current collector 12a and the current collector 12b.

The entire size of comb-shaped electrodes; the thickness, length, and number of teeth in the comb-shaped electrode 11a or the comb-shaped electrode 11b; the space between two adjacent teeth; the thickness of active material layers, etc. may be appropriately adjusted depending on the desirable charged capacity and discharged capacity. For example, 10 to 50 μm of the thickness of teeth, 30 to 70 μm of the space between two adjacent teeth, and 10 to 50 μm of the thickness of active material layers may be employed.

The material to construct the positive-electrode active material layer 13a and the negative-electrode active material layer 13b and the type of the electrolyte may be appropriately set depending on the type of the cell to be formed. In regards to a lithium ion secondary cell, as an example, the material to construct the positive-electrode active material layer 13a may be exemplified by transition metal oxides such as lithium cobaltate, the material to construct the negative-electrode active material layer 13b may be exemplified by carbon, graphite, lithium titanate, etc.; and the electrolyte may be exemplified by electrolyte liquids containing a salt such as lithium perchlorate and lithium hexafluorophosphate and an organic solvent in which the salt is soluble such as carbonate ester compounds including ethylene carbonate, dimethyl carbonate and diethyl carbonate, and acetonitrile, and mixtures of two or more of them, and gel-like electrolytes containing the above-mentioned electrolyte liquids and polymers such as polyethylene oxide, polypropylene oxide, polyacrylonitrile, and polymethacrylonitrile. Occurrence of liquid leak from the resulting secondary cells can be effectively reduced by use of the above-mentioned gel-like electrolyte as the electrolyte.

More specifically, the active material may be exemplified by particles of positive-electrode active materials such as $LiCoO_2$, $LiFePO_4$, and $LiMn_2O_4$ and particles of negative-electrode active materials such as graphite, $Li_4Ti_5O_{12}$, Sn alloys, and Si-based compounds. When forming the active material layer, preferably, the active material is used in a condition of dispersion liquid where the active material is dispersed in a dispersion medium. The dispersion medium used may be exemplified by water, acetonitrile, N-methylpyrrolidone, acetone, ethanol, etc. Preferably, the amount of the dispersion medium used is the amount that leads to 35 to 60 mass % of solid content concentration in the dispersion liquid.

The dispersion liquid typically contains a binder such as styrene-butadiene rubber (SBR) and polyvinylidene fluoride. The dispersion liquid may also contain a conductive aid such as carbon black (e.g. acetylene black) and a dispersant such as carboxymethylcellulose. The contents of the active material, binder, conductive aid, and dispersant in the solid content of the dispersion liquid are not particularly limited. In the solid content of the dispersion liquid, the content of the active material is preferably 85 to 99 mass %, the content of the binder is preferably 1 to 15 mass %, the content of the conductive aid is preferably 0 to 9 mass %, and the content of the dispersant is preferably 0 to 7 mass %. Particularly, when the content of the conductive aid is within the above-mentioned range, belt-like residual dross of active materials extending in a squeegee-moving direction is unlikely to appear on the surface of the resist layer 2 or 5 during filling the dispersion liquid into the guide hole 3a or 3b by a screen printing process in the step shown in FIG. 1D or 1G and also whisker-like residual dross of active materials is unlikely to appear in the resulting comb-shaped electrodes, thereby short circuit between electrodes can be effectively prevented.

In the above-mentioned electrolyte, preferably, the content of the salt is adjusted such that the concentration of metal atom (e.g. lithium atom) constituting the salt is 0.2 to 2.0 M. In the above-mentioned gel-like electrolyte, preferably, the content of the polymer is 2 to 80 mass %. The above-mentioned electrolyte liquid may also contain an additive including unsaturated cyclic carbonate ester compounds such as vinylene carbonate, halogen-substituted carbonate ester compounds such as fluoroethylene carbonate, cyclic sulfonate-based compounds such as 1,3-propane sultone, cyclic sulfite ester compounds such as ethylene sulfite, crown ethers such as 12-crown-4, and aromatic compounds such as benzene and toluene. When the electrolyte liquid contains the additive, operating life of the resulting secondary cells tends to be longer. The concentration of the additive is preferably 0.1 to 20 mass % in the electrolyte liquid.

The comb-shaped electrodes 11a and 11b shown in FIG. 2 can be produced by forming a conductive layer on the surface of the substrate 14, patterning the conductive layer to form current collectors 12a and 12b, and forming a positive electrode and a negative electrode on the current collectors 12a and 12b using the pattern forming method according to the embodiment of the present invention explained with reference to FIGS. 1A to 1H, for example. The conductive layer and current collectors 12a and 12b can be formed by the method described in Patent Document 1, for example. The negative and positive electrodes can be formed on the current collectors 12a and 12b by forming a pattern in accordance with FIGS. 1A to 1H using the current collectors 12a and 12b of FIG. 2 as the support in FIGS. 1A to 1H, using the positive-electrode active material layer 13a of FIG. 2 as the first pattern material layer 4a in FIGS. 1A to 1H, and using the negative-electrode active material layer 13b of FIG. 2 as the second pattern material layer 4b in FIGS. 1A to 1H, for example.

EXAMPLES

The present invention is explained more specifically with reference to examples hereinafter; however, the present invention is not limited to the examples at all.

Synthesis Example 1

Propyleneglycol monomethylether acetate (PGMEA) as a solvent was added to 70 parts by mass of a cresol-type novolac resin (mass average molecular weight: 30000)

resulting from an ordinary method of addition condensation between a mixture of m-cresol and p-cresol (m-cresol/p-cresol=6/4 (mass ratio)) and formaldehyde in the presence of an acid catalyst, 15 parts by mass of naphthoquinone-1,2-diazide-5-sulfonic acid diester of 1,4-bis(4-hydroxyphenyl isopropylidenyl)benzene as a photosensitizing agent, and 15 parts by mass of poly(methyl vinyl ether) (mass average molecular weight: 100000) as a plasticizer such that the solid content concentration is 40 mass % followed by mixing and dissolving them, thereby obtaining a resist composition 1. The resist composition 1 is novolac type, non-chemical amplification type, and positive type.

Synthesis Example 2

52.5 parts by mass of a cresol-type novolac resin (mass average molecular weight: 10000) resulting from an ordinary method of addition condensation between a mixture of m-cresol and p-cresol (m-cresol/p-cresol=6/4 (mass ratio)) and formaldehyde in the presence of an acid catalyst, 10 parts by mass of a polyhydroxystyrene resin VPS-2515 (manufactured by Nippon Soda Co.), 27.5 parts by mass of a resin expressed by Formula (1) below, 10 parts by mass of a resin expressed by Formula (2) below, 2 parts by mass of a compound expressed by Formula (3) below as an acid generator, 2 parts by mass of 1,5-dihydroxynaphthalene as a sensitizer, 0.01 parts by mass of triethylamine and 0.02 parts by mass of salicylic acid as additives, and 107 parts by mass of PGMEA and 6 parts by mass of gamma-butyrolactone as solvents were mixed and dissolved, thereby obtaining a resist composition 2. The resist composition 2 is chemical amplification type and positive type.

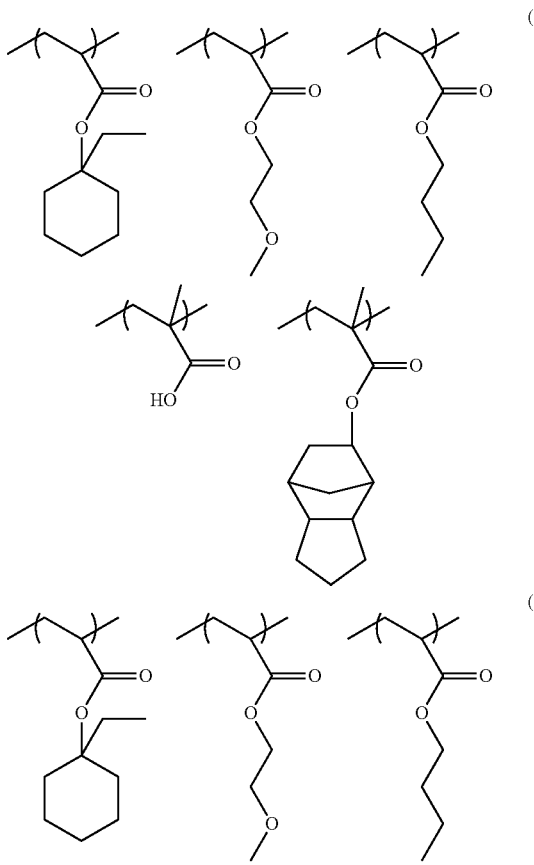

(1)

(2)

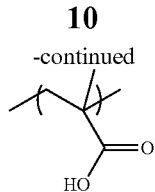

-continued

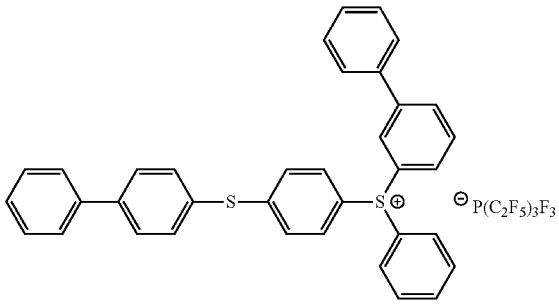

(3)

Example 1

Figure 2:
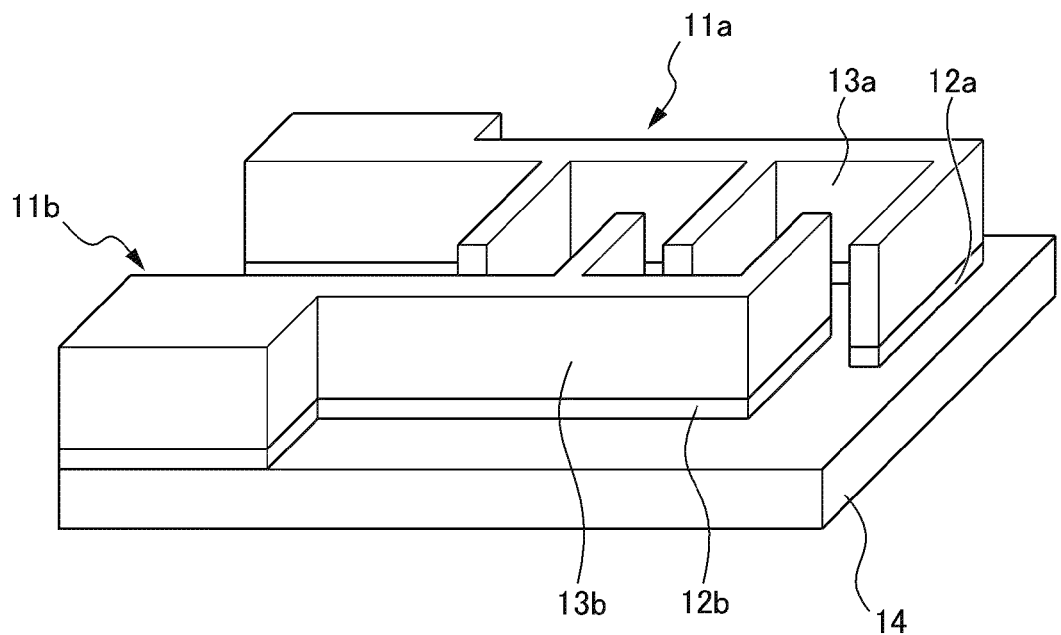
FIG. 2 is a perspective view schematically showing comb-shaped electrodes produced in accordance with an embodiment of the method for producing a comb-shaped electrode of the present invention.

The comb-shaped electrodes 11a and 11b shown in FIG. 2 were prepared using a screen printing process.

(Formation of Current Collector)

Initially, an aluminum film (thickness: 200 nm) as a conductive layer was formed by a sputtering process on the surface of a silicon substrate having an oxide film. The positive-type resist composition 1 of Synthesis Example 1 was coated on the substrate by a spin coating process to thereby form a resist layer of 1.5 μm, followed by drying at 120° C. for 1 minute. Then, the resist layer was selectively exposed (ghi mixed rays, exposure amount: 100 mJ/cm$^2$) using a mask with a pattern corresponding to the comb-shaped electrodes 11a and 11b shown in FIG. 2. Next, development was carried out with an alkaline developer of 2.38 mass % TMAH for 1 minute. After the development, etching was performed by a dipping process using an aluminum etching liquid ($H_3PO_4$:$HNO_3$:$H_2O$=4:1:1.6 (mass ratio)) to thereby form an aluminum pattern, thereby forming comb-shaped current collectors 12a and 12b.

(Preparation of Guide Hole (i))

The resist composition of Synthesis Example 1 was coated by a spin coating process on a surface of silicon wafer on which the current collector had been formed, to thereby form a resist layer of 50 μm, followed by drying at 140° C. for 5 minutes. Then, using a positive mask having the same shape in planar view as that of the above-formed comb-shaped current collector 12a, the resist layer at the position above the comb-shaped current collectors was exposed (ghi mixed rays, exposure amount: 60 mJ/cm$^2$). Next, baking was carried out at 85° C. for 3 minutes as an activation step, followed by development with an alkaline developer. Consequently, a comb-shaped guide hole having the same shape in planar view as that of the current collector 12a was formed on the surface of the silicon wafer. The current collector 12a was exposed at the base of the guide hole.

(Formation of Active Material Layer (i))

38.7 g of LiFePO$_4$ particles, 2.58 g of acetylene black as a conductive aid, 0.43 g of carboxymethylcellulose as a dispersant, and 1.29 g of styrene-butadiene rubber (SBR) as a binder (mass ratio of 90:6:1:3) were mixed and 57 g of water was further added and mixed, thereby obtaining a dispersion liquid with a solid content of 43 mass %. The dispersion liquid was further mixed and dispersed by rotating at 2000 rpm for 10 minutes in a rotation-revolution type mixer (product name: Awatori Neritaro, manufactured by Thinky Co.) and the resulting mixture was used as a positive-electrode active material.

The screen printing was carried out on the silicon wafer where the guide hole had been formed and the positive-electrode active material was filled into the guide hole followed by drying at 100° C. for 5 minutes, thereby forming a positive-electrode active material layer. The screen printing was carried out at a squeegee pressure of 180 MPa and a squeegee speed of 15.0 mm/sec using a screen printer (model MT-320T, manufactured by Micro-tec Co.) equipped with a silicon squeegee polished to an angle of 45° and having a hardness of 60°.

(Preparation of Guide Hole (ii))

The resist composition 2 of Synthesis Example 2 was coated by a spin coating process on a surface of silicon wafer on which the positive-electrode active material had been deposited to thereby form a resist layer of 10 μm, followed by drying at 140° C. for 1 minute and formation of a protective layer.

(Preparation of Guide Hole (ii))

Using a positive mask having the same shape in planar view as that of the above-formed comb-shaped current collector 12b, the resist layer at the position above the comb-shaped current collectors was exposed (ghi mixed rays, exposure amount: 60 mJ/cm$^2$). Next, baking was carried out at 85° C. for 3 minutes as an activation step, followed by development with an alkaline developer. Consequently, while protecting the positive-electrode active material by the protective layer, a comb-shaped guide hole having the same shape in planar view as that of the current collector 12b was formed on the surface of the silicon wafer. The current collector 12b was exposed at the base of the guide hole.

(Formation of Active Material Layer (ii))

38.7 g of $Li_4Ti_5O_{12}$ particles, 2.58 g of acetylene black as a conductive aid, 0.43 g of carboxymethylcellulose as a dispersant, and 1.29 g of SBR as a binder (mass ratio of 90:6:1:3) were mixed and 57 g of water was further added and mixed, thereby obtaining a dispersion liquid with a solid content of 43 mass %. The dispersion liquid was further mixed and dispersed by rotating at 2000 rpm for 10 minutes in a rotation-revolution type mixer (product name: Awatori Neritaro, manufactured by Thinky Co.) and the resulting mixture was used as a negative-electrode active material.

The screen printing was carried out on the silicon wafer where the guide hole had been formed and the negative-electrode active material was filled into the guide hole followed by drying at 100° C. for 5 minutes, thereby forming a negative-electrode active material layer. The screen printing was carried out at a squeegee pressure of 180 MPa and a squeegee speed of 15.0 mm/sec using a screen printer (model MT-320T, manufactured by Micro-tec Co.) equipped with a silicon squeegee polished to an angle of 45° and having a hardness of 60°.

(Peeling of Resist Layer)

Finally, the resist layer was peeled off with acetone, thereby obtaining comb-shaped electrodes 11a and 11b. The time required for filling the electrode active materials by the screen printing process was as very short as 15 minutes.

Comparative Example 1

The comb-shaped electrodes 11a and 11b shown in FIG. 2 were prepared using an injection process.

(Formation of Current Collector)

Comb-shaped current collectors 12a and 12b were formed similarly to Example 1.

(Preparation of Guide Hole)

The resist composition of Synthesis Example 1 was coated by a spin coating process on a surface of silicon wafer on which the current collector had been formed to thereby form a resist layer of 50 μm, followed by drying at 140° C. for 5 minutes. Then, using a positive mask having the same shape in planar view as that of the above-formed comb-shaped current collector, the resist layer at the position above the comb-shaped current collectors was exposed (ghi mixed rays, exposure amount: 60 mJ/cm$^2$). Next, baking was carried out at 85° C. for 3 minutes as an activation step, followed by development with an alkaline developer. Consequently, a comb-shaped guide hole was formed on the surface of the silicon wafer. The current collector was exposed at the base of the guide hole.

(Formation of Active Material Layer)

Using a micropipette, among the guide holes formed as described above, the positive-electrode active material of Example 1 was made to fall in drops around the guide holes corresponding to positive electrodes and the negative-electrode active material of Example 1 was made to fall in drops around the guide holes corresponding to negative electrodes to carefully allow flowing into the guide holes with a comb-shaped pattern. Subsequently, an active material layer was formed by drying at 100° C. for 5 minutes. Finally, the resist layer was peeled off with acetone, thereby obtaining comb-shaped electrodes 11a and 11b. The time required for filling the electrode active materials by the injection process was as very long as 3 hours.

Example 2

Figure 3A:
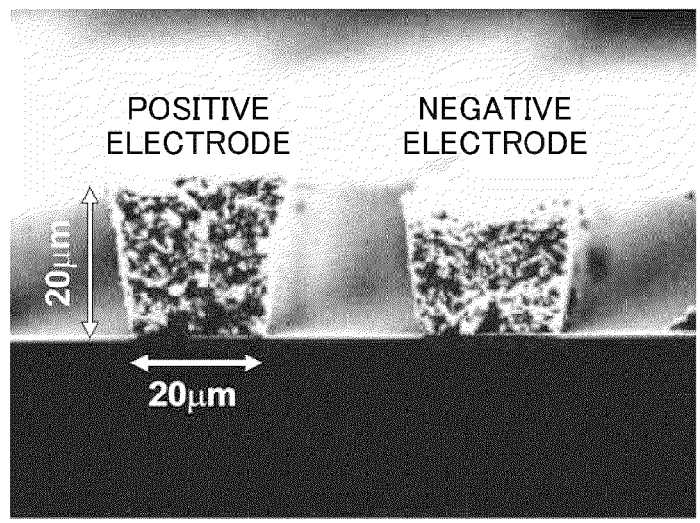
FIGS. 3A, 3B, and 3C are photographs that show the results of SEM or EDX (energy dispersive X-ray spectroscopy) observation of a cross section of a comb-shaped electrode produced in accordance with an embodiment of the method for producing a comb-shaped electrode of the present invention.
Figure 3B:
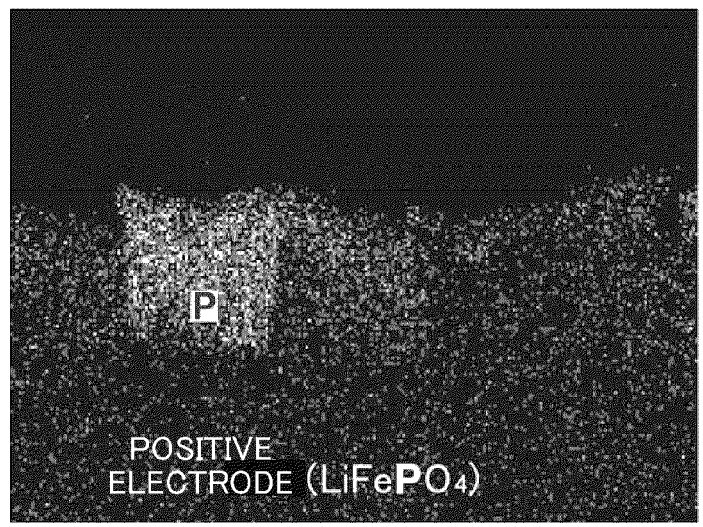
Figure 3C:
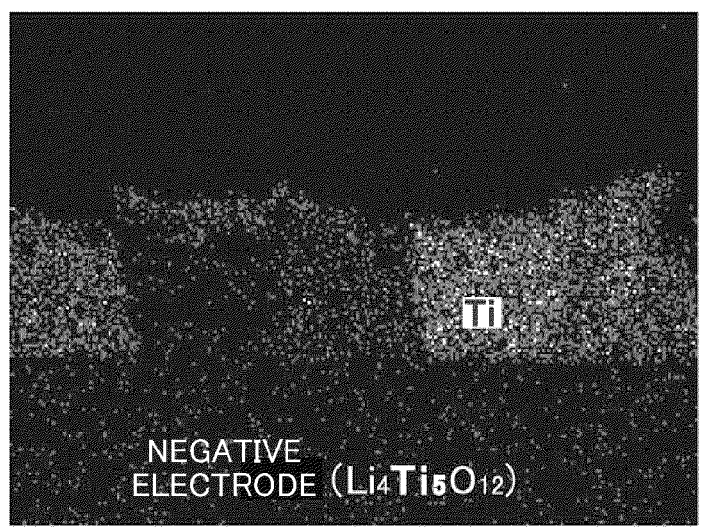

The cross section of the comb-shaped electrodes 11a and 11b resulting from Example 1 was observed by SEM and EDX (energy dispersive X-ray spectroscopy). The results are shown in FIGS. 3A, 3B, and 3C. As shown in FIG. 3A, in regards to the comb-shaped electrodes 11a and 11b, it could be confirmed that the positive-electrode active material and the negative-electrode active material were filled with tracing the shape of guide holes without variation. Furthermore, as shown in FIG. 3B, existence of phosphorus was observed in the positive electrodes and thus filling of the positive-electrode active material could be confirmed. On the other hand, as shown in FIG. 3C, existence of titanium was observed in the negative electrodes and thus filling of the negative-electrode active material could be confirmed.

Presence or Absence of of Residual Dross

Example 3

The comb-shaped electrodes 11a and 11b shown in FIG. 2 were prepared similarly to Example 1 except that the mass ratio of $LiFePO_4$ particles, acetylene black, carboxymethylcellulose, and SBR was changed to 87:6:5:2 and the solid content of the dispersion liquid was changed to 42 mass % when preparing the positive-electrode active material, and the mass ratio of $Li_4Ti_5O_{12}$ particles, acetylene black, carboxymethylcellulose, and SBR was changed to 87:6:5:2 and the solid content of the dispersion liquid was changed to 42 mass % when preparing the negative-electrode active material.

Immediately after filling the positive-electrode active material or the negative-electrode active material into the guide holes, the surface of the resist was observed with an optical microscope. As a result, belt-like residual dross of the positive-electrode active material or the negative-electrode active material extending in a squeegee-moving direction was not observed on the surface of the resist.

As the result that the prepared comb-shaped electrodes were observed by SEM, whisker-like residual dross of the positive-electrode active material or the negative-electrode active material was also not observed.

Reference Example

The comb-shaped electrodes 11a and 11b shown in FIG. 2 were prepared similarly to Example 3 except that the mass size of comb-shaped electrodes, thickness of teeth, space between two adjacent teeth, length of teeth, number of teeth, and thickness of active material layers were set as shown in Table 1.

The space between the resulting comb-shaped electrodes 11a and 11b was filled with an electrolyte liquid (1M LiClO$_4$ solution, solvent: mixture liquid of ethylene carbonate and diethyl carbonate of volume ratio 1:1) to thereby prepare secondary cells.

Figure 4:
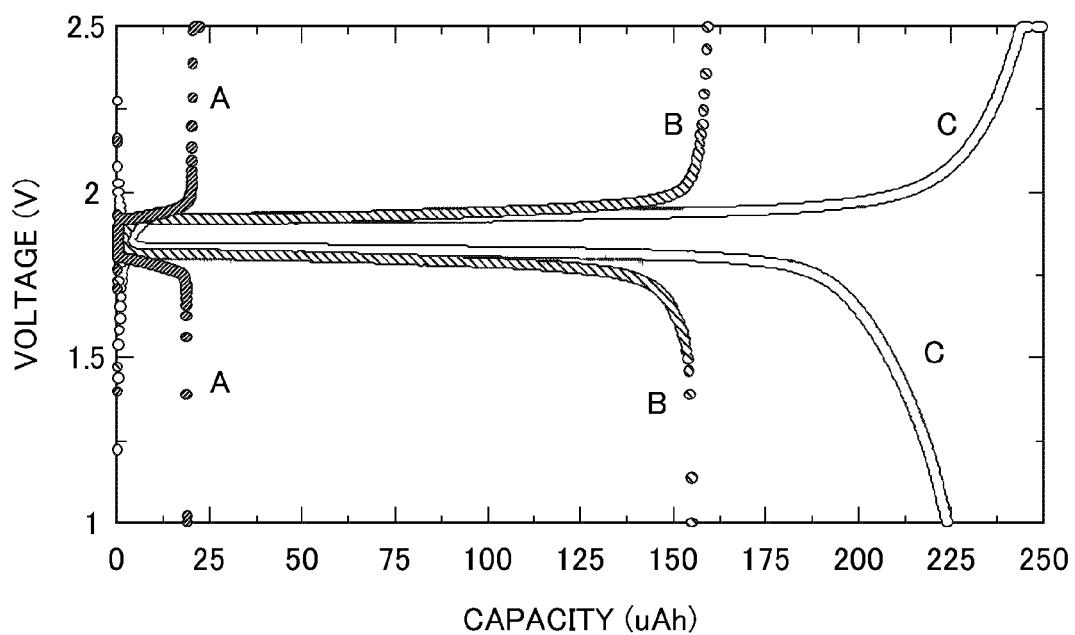
FIG. 4 is a graph that shows the charge-discharge curves measured by changing the area occupied by the active materials in a comb-shaped electrode produced in accordance with an embodiment of the method for producing a comb-shaped electrode of the present invention; the English characters in the figure represent the type of the comb-shaped electrode.

These secondary cells were charged and discharged with setting a current value to 20 μA (Example 4), 160 μA (Example 5), or 225 μA (Example 6). The charge-discharge curves are shown in FIG. 4. The values of discharged capacities read from the charge-discharge curves are also shown in Table 1. Note that the English characters A to C in FIG. 4 represent the comb-shaped electrodes A to C, respectively.

TABLE 1

| | Comb-Shaped Electrodes | Entire Size of Comb-Shaped Electrodes (mm × mm) | Thickness of Teeth (μm) | Space between Teeth (μm) | Length of Teeth (mm) | Number of Teeth | Thickness of Active Material Layers (μm) | Discharged Capacity (μAh) |
|---|---|---|---|---|---|---|---|---|
| Example 4 | A | 10 × 10 | 40 | 60 | 9.96 | 40 | 20 | 20 |
| Example 5 | B | 25 × 13 | 40 | 60 | 12.90 | 125 | 20 | 160 |
| Example 6 | C | 25 × 13 | 40 | 40 | 12.92 | 156 | 20 | 225 | ratio of LiFePO$_4$ particles, acetylene black, carboxymethylcellulose, and SBR was changed to 81:12:5:2 and the mass ratio of Li$_4$Ti$_5$O$_{12}$ particles, acetylene black, carboxymethylcellulose, and SBR was changed to 81:12:5:2.

Immediately after filling the positive-electrode active material or the negative-electrode active material into the guide holes, the surface of the resist was observed with an optical microscope. As a result, belt-like residual dross of the positive-electrode active material or the negative-electrode active material extending in a squeegee-moving direction was observed on the surface of the resist.

As the result that the prepared comb-shaped electrodes were observed by SEM, whisker-like residual dross of the positive-electrode active material or the negative-electrode active material was also observed.

It is understood from the above that whisker-like residual dross of the positive-electrode active material or the negative-electrode active material does not appear and short circuit between electrodes can be prevented by way that the amount of acetylene black, a conductive aid, is reduced by half from 12 mass % to 6 mass % in the positive-electrode active material or the negative-electrode active material.

Capacity Increase by Area Enlargement

Examples 4 to 6

The comb-shaped electrodes 11a and 11b shown in FIG. 2 were prepared similarly to Example 3 except that the entire It is understood from the comparison between Examples 4 and 5 that the discharged capacity of the secondary cells with the comb-shaped electrodes produced by the pattern forming method according to the present invention is improved by way that the entire size of the comb-shaped electrodes increases and that the area occupied by the active materials is enlarged. It is also understood from the comparison between Examples 5 and 6 that, when the areas of the comb-shaped electrodes are the same, the discharged capacity is improved by way that the space between the teeth is narrowed and that the area occupied by the active materials is enlarged.

Capacity Increase by Thickening

Examples 7 and 8

Figure 5:
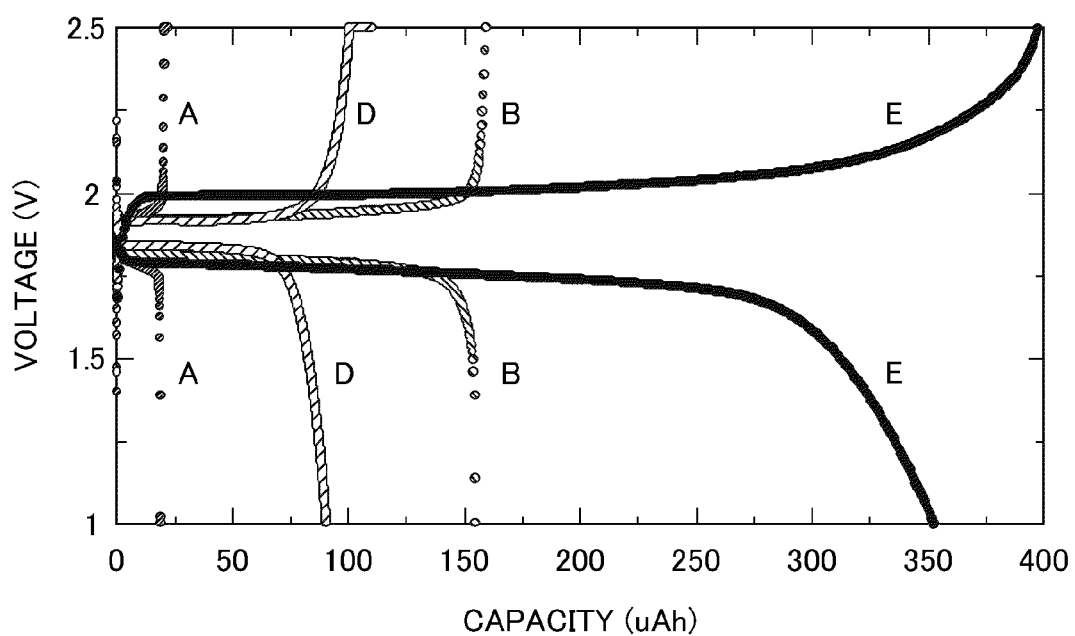
FIG. 5 is a graph that shows the charge-discharge curves measured by changing the thickness of the active material layers in a comb-shaped electrode produced in accordance with an embodiment of the method for producing a comb-shaped electrode of the present invention; the English characters in the figure represent the type of the comb-shaped electrode.

Preparation of the comb-shaped electrodes 11a and 11b shown in FIG. 2, preparation of secondary cells, and charging and discharging were performed similarly to Example 4 or 5 except that the thickness of the active material layers were changed as shown in Table 2. Note that, regarding Examples 7 and 8, the current value was set to 90 μA (Example 7) or 353 μA (Example 8). The charge-discharge curves are shown in FIG. 5. The values of discharged capacities read from the charge-discharge curves are also shown in Table 2. Note that the results of Examples 4 and 5 are also shown in FIG. 5 and Table 2 for comparison. The English characters A, B, D, and E in FIG. 5 represent the comb-shaped electrodes A, B, D, and E, respectively.

TABLE 2

|  | Comb-Shaped Electrodes | Entire Size of Comb-Shaped Electrodes (mm × mm) | Thickness of Teeth (μm) | Space between Teeth (μm) | Length of Teeth (mm) | Number of Teeth | Thickness of Active Material Layers (μm) | Discharged Capacity (μAh) |
|---|---|---|---|---|---|---|---|---|
| Example 4 | A | 10 × 10 | 40 | 60 | 9.96 | 40 | 20 | 20 |
| Example 7 | D | 10 × 10 | 40 | 60 | 9.96 | 40 | 40 | 90 |
| Example 5 | B | 25 × 13 | 40 | 60 | 12.90 | 125 | 20 | 160 |
| Example 8 | E | 25 × 13 | 40 | 60 | 12.92 | 125 | 40 | 353 |

It is understood from the comparison between Examples 4 and 7 and the comparison between Examples 5 and 8 that the discharged capacity of the secondary cells with the comb-shaped electrodes produced by the pattern forming method according to the present invention is improved by way that the thickness of the active material layers is further increased.

Lifetime Extension by Addition of Additive

Example 9

Figure 6:
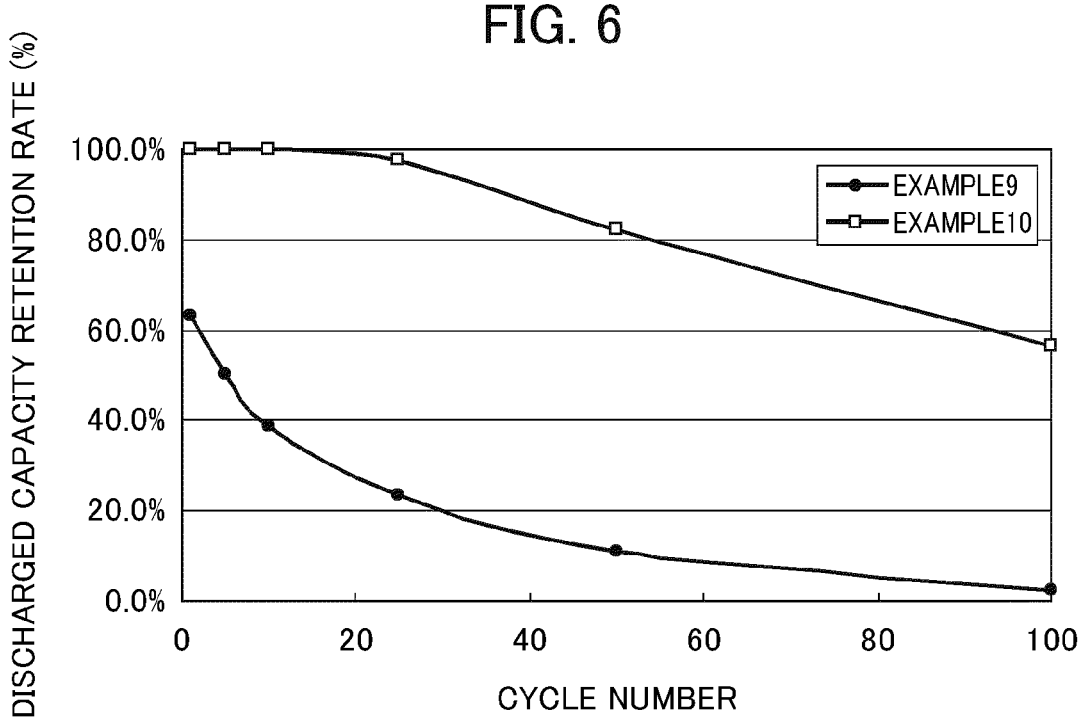
FIG. 6 is a graph that shows the relationship between the cycle number and the discharged capacity retention rate for a comb-shaped electrode produced in accordance with an embodiment of the method for producing a comb-shaped electrode of the present invention.

Preparation of the comb-shaped electrodes 11a and 11b shown in FIG. 2, preparation of secondary cells, and charging and discharging were performed similarly to Example 8. Charging and discharging were repeated for 100 cycles, and the charged capacities and discharged capacities at 1, 5, 10, 25, 50, and 100 cycles were measured. The discharged capacity retention rate at each cycle is shown in FIG. 6 with the discharged capacity at 1 cycle set to 100%.

Example 10

Secondary cells were prepared, and the charged capacities and discharged capacities at 1, 5, 10, 25, 50, and 100 cycles were measured similarly to Example 9 except that a solution containing 5 mass % vinylene carbonate in addition to 1M $LiClO_4$ (solvent: mixture liquid of ethylene carbonate and diethyl carbonate of volume ratio 1:1) was used as an electrolyte liquid. The discharged capacity retention rate at each cycle is shown in FIG. 6 with the discharged capacity at 1 cycle set to 100%.

It is understood from the comparison between Examples 9 and 10 that the lifetime of the secondary cells with the comb-shaped electrodes produced by the pattern forming method according to the present invention is improved by way that vinylene carbonate is added to the electrolyte liquid as an additive.

Gelation of Electrolyte

Example 11

Electrolyte liquid was prepared by mixing 3 parts by mass of polyethylene oxide with the mass average molecular weight of 80,000, 10 parts by mass of acetonitrile, and 7.2 parts by mass of 1M $LiClO_4$ solution (solvent: mixture liquid of ethylene carbonate and diethyl carbonate of volume ratio 1:1).

1,000 μl of this electrolyte liquid was dropwise added into a guide formed by enclosure with ethylene-propylene-diene rubber plates with a thickness of 3 mm and with a width of 2 mm arranged on a $SiO_2$ substrate. After drying at 80° C. for 30 minutes, the state was observed to get gelled.

The surface resistance of the gelled electrolyte formed as described above was measured to be 100 kΩ with a tester in the atmosphere in 3 minutes after the end of the drying.

The impedance of the gelled electrolyte was measured as described below. A polyimide film with a diameter of 8 mm and with a thickness of 60 μm having a through-hole with a diameter of 5 mm was adhered tightly onto a Au substrate with a thickness of 2 mm. The electrolyte liquid containing polyethylene oxide was dropwise added into the concave part formed with the Au substrate and the through-hole and dried at 80° C. for 20 minutes. Another Au substrate with a thickness of 2 mm was placed on the polyimide film and the formed gelled electrolyte. Voltage was applied between the two Au substrates under the conditions described below, and the impedance was measured to be $5.66 \times 10^{-4}$ Scm$^{-1}$.

Conditions: initial voltage 0.2 V, frequency range 0.1 to 10,000 Hz, amplitude 0.005 V, downtime 2 seconds, temperature 23° C.

Figure 7:
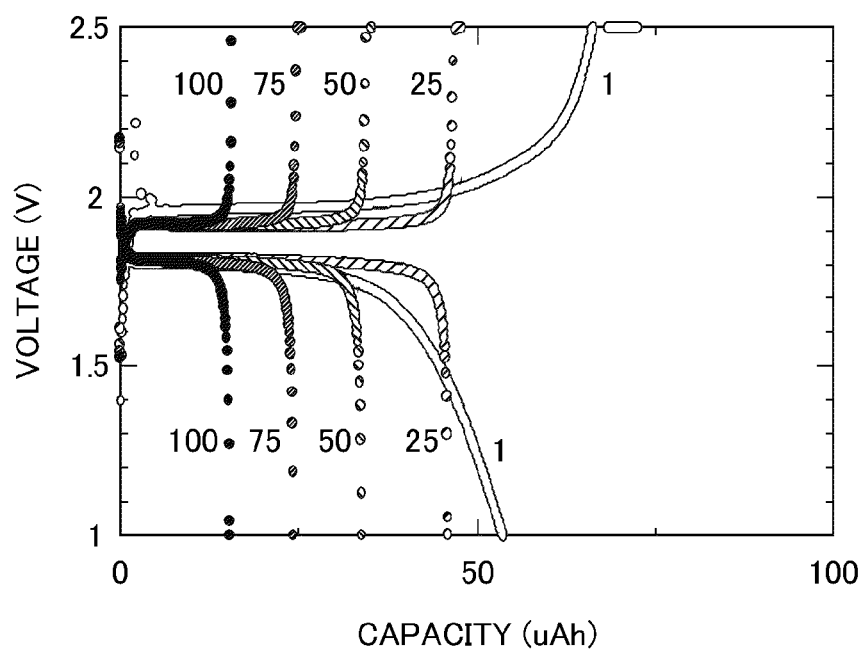
FIG. 7 is a graph that shows the charge-discharge curves measured by changing the cycle numbers using a gelled electrolyte for a comb-shaped electrode produced in accordance with an embodiment of the method for producing a comb-shaped electrode of the present invention; the English characters in the figure represent the type of the comb-shaped electrode; the numbers in the figure represent cycle numbers.

The comb-shaped electrodes 11a and 11b shown in FIG. 2 were prepared similarly to Example 3 except that the entire size of comb-shaped electrodes, thickness of teeth, space between two adjacent teeth, length of teeth, number of teeth, and thickness of active material layers were set as shown in Table 3. The electrolyte liquid containing polyethylene oxide was dropwise added into the space between the resulting comb-shaped electrodes 11a and 11b and dried at 80° C. for 20 minutes. Thereby, secondary cells in which the space was filled with the gelled electrolyte were prepared. These secondary cells were charged and discharged with setting a current value to 50 μA. Charging and discharging were repeated for 100 cycles, and the charged capacities and discharged capacities at 1, 25, 50, 75, and 100 cycles were measured. The charge-discharge curves are shown in FIG. 7. Note that the numbers in FIG. 7 represent cycle numbers.

TABLE 3

|  | Entire Size of Comb-Shaped Electrodes (mm × mm) | Thickness of Teeth (μm) | Space between Teeth (μm) | Length of Teeth (mm) | Number of Teeth | Thickness of Active Material Layers (μm) |
|---|---|---|---|---|---|---|
| Example 10 | 10 × 10 | 40 | 60 | 9.996 | 40 | 40 |

It is understood from these results that the secondary cells with the comb-shaped electrode produced by the pattern forming method according to the present invention have a good charge-discharge property even when a gelled electrolyte were used.

Rate Property

Example 12

Figure 8:
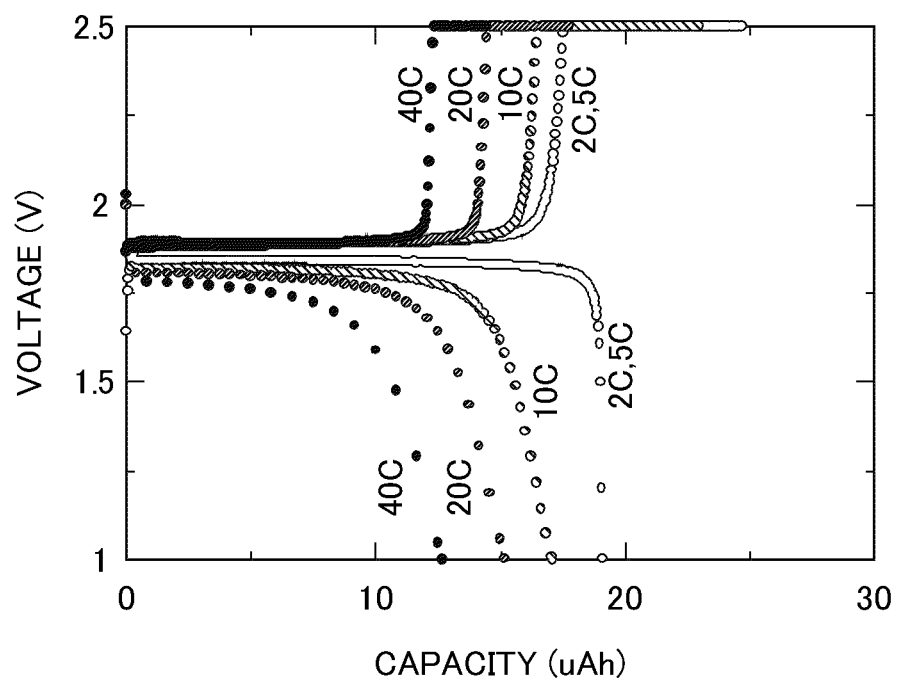
FIG. 8 is a graph that shows the charge-discharge curves measured by changing the C-rate for a comb-shaped electrode produced in accordance with an embodiment of the method for producing a comb-shaped electrode of the present invention.

Regarding the comb-shaped electrode prepared in Example 4, charging and discharging were performed similarly to Example 4 with a C-rate set to 1C, 2C, 5C, 10C, 20C, or 40C. The charge-discharge curves are shown in FIG. 8. The discharged capacity retention rate at each C-rate is shown in Table 4 with the discharged capacity at 1C set to 100%.

TABLE 4

| C-rate | 1 | 2 | 5 | 10 | 20 | 40 |
|---|---|---|---|---|---|---|
| Discharged Capacity Retention Rate (%) | 100 | 100 | 100 | 94 | 83 | 69 |

It is understood from the results that the secondary cells with the comb-shaped electrode produced by the pattern forming method according to the present invention have a good discharged capacity retention rate even when the C-rate increases, and have an equal performance to the secondary cells with the comb-shaped electrode produced by the injection process.

Cycle Property

Example 13

Figure 9A:
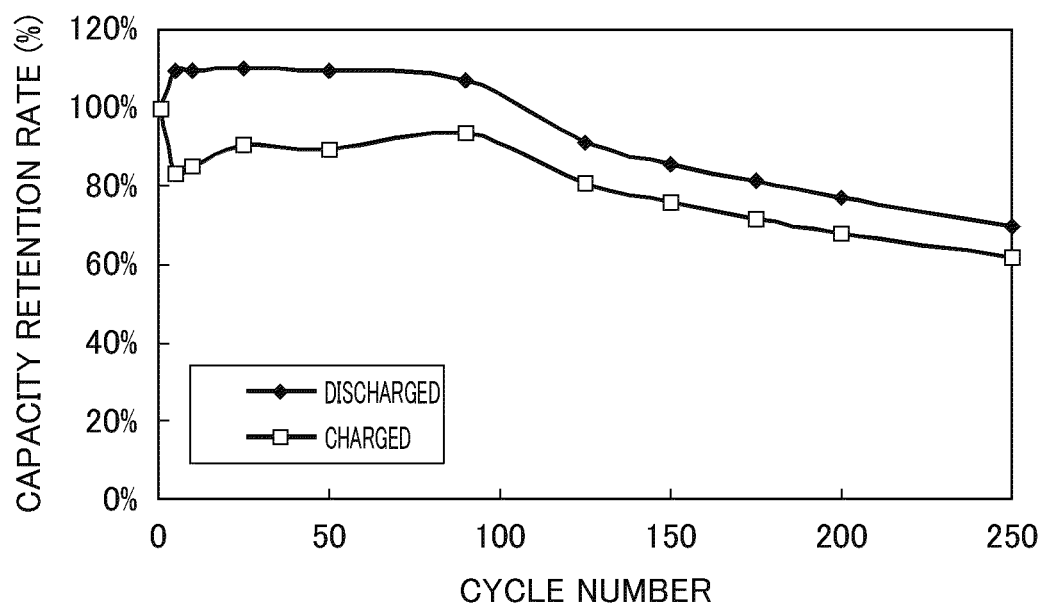
FIGS. 9A and 9B are graphs that show the cycle property of a comb-shaped electrode produced in accordance with an embodiment of the method for producing a comb-shaped electrode of the present invention.
Figure 9B:
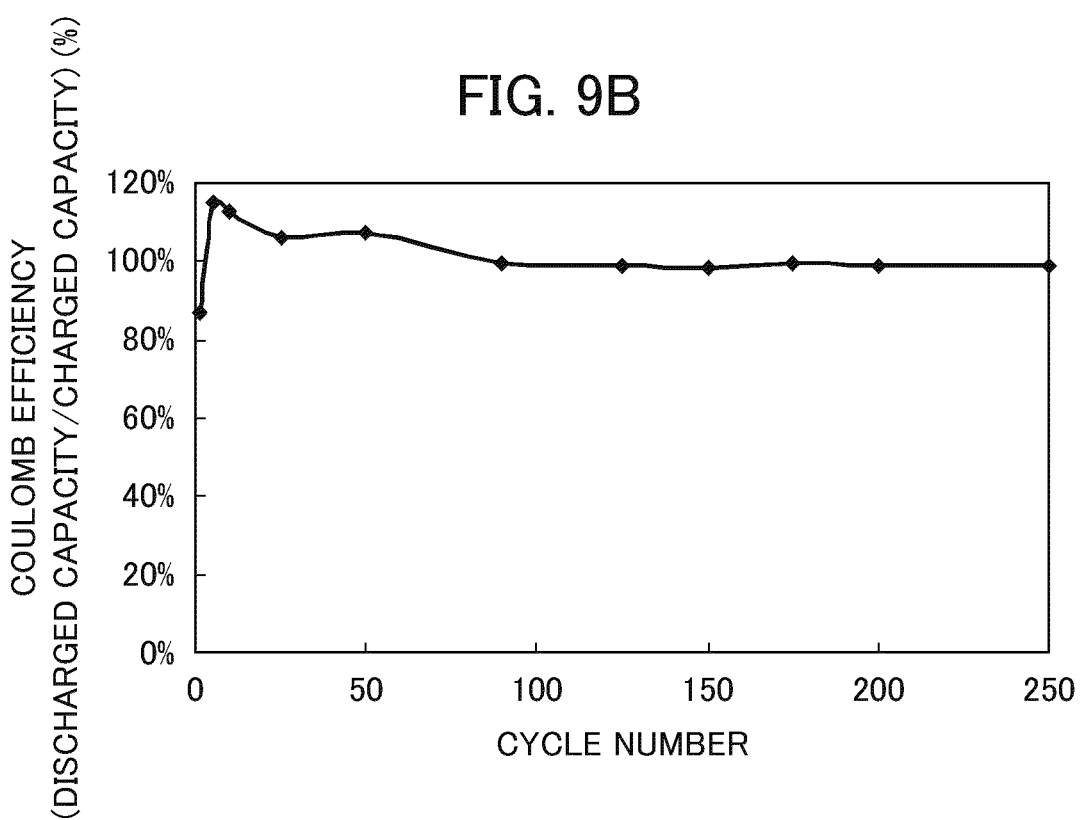

Regarding the comb-shaped electrode prepared in Example 4, charging and discharging were performed similarly to Example 4. Charging and discharging were repeated for 250 cycles, and the charged capacities and discharged capacities were measured at predetermined cycles. The capacity retention rate at each cycle is shown in FIG. 9A with the charged capacity and the discharged capacity at 1 cycle set to 100%. The coulomb efficiency (namely, discharged capacity/charged capacity) at each cycle is shown in FIG. 9B.

It is understood from these results that, even after 250 cycles, the secondary cells with the comb-shaped electrode produced by the pattern forming method according to the present invention have a stable capacity retention rate and retain a coulomb efficiency at a high value of 98.8%.

What is claimed is:
1. A method for forming a pattern, in which n patterns (n: an integer of at least 2) of identical or different pattern materials are formed on a support, the method comprising:
   forming a first resist layer by coating a positive-type resist composition on a surface of the support,
   with respect to a kth pattern material and a kth resist layer in order of from k=1 to k=n−1 (k: an integer of 1 to n−1), repeating the steps of (i) to (iii):
      (i) forming a guide hole through 1st to kth resist layers by exposure and development,
      (ii) filling a kth pattern material into the guide hole by a screen printing process, and
      (iii) forming a (k+1)th resist layer by coating a positive-type resist composition on the kth resist layer and the kth pattern material that has been filled into the guide hole,
   forming a guide hole through 1st to nth resist layers by exposure and development,
   completely filling a nth pattern material into the guide hole by a screen printing process, and
   removing the 1st to nth resist layers.
2. A method for producing a comb-shaped electrode, in which a positive electrode and a negative electrode are each formed into a comb shape and oppositely disposed so that parts of teeth of the comb shapes are alternately arranged, the method comprising:
   forming a conductive layer on a surface of a substrate,
   forming a current collector by patterning the conductive layer, and
   forming the positive electrode and the negative electrode on the current collector using the method for forming a pattern according to claim 1.

* * * * *